US006203661B1

(12) United States Patent
Siniaguine et al.

(10) Patent No.: US 6,203,661 B1
(45) Date of Patent: Mar. 20, 2001

(54) BRIM AND GAS ESCAPE FOR NON-CONTACT WAFER HOLDER

(75) Inventors: Oleg Siniaguine; Sergey Savastiouk, both of San Jose; Alex Berger, Palo Alto, all of CA (US)

(73) Assignee: TruSi Technologies, LLC, Sunnyvale, CA (US)

( * ) Notice: Subject to any disclaimer, the term of this patent is extended or adjusted under 35 U.S.C. 154(b) by 0 days.

(21) Appl. No.: 09/457,042

(22) Filed: Dec. 7, 1999

(51) Int. Cl.[7] ........................................ C23F 1/02

(52) U.S. Cl. ...................... 156/345; 118/500; 118/728

(58) Field of Search ........................ 156/345; 118/728, 118/721, 500

(56) References Cited

U.S. PATENT DOCUMENTS

| 3,594,609 | 7/1971 | Vas et al. ............... 315/111 |
| 3,639,831 | 2/1972 | Cushman ................ 324/33 |
| 3,743,781 | 7/1973 | Holden .................. 219/38 |
| 3,798,408 | 3/1974 | Foex et al. .............. 219/121 |
| 3,818,174 | 6/1974 | Camacho ................ 219/121 |
| 3,828,162 | 8/1974 | Holden .................. 219/383 |
| 3,980,467 | 9/1976 | Camacho et al. ......... 75/10 R |
| 4,382,099 | 5/1983 | Legge et al. ............ 427/34 |
| 4,420,346 | 12/1983 | Belkin et al. .......... 148/4 |
| 4,517,495 | 5/1985 | Piepmeier .............. 315/111.21 |
| 5,041,713 | 8/1991 | Weidman ............... 129/121.51 |
| 5,560,779 | 10/1996 | Knowles et al. ........ 118/723 |
| 5,562,841 | 10/1996 | Kulik et al. ........... 219/121.59 |
| 5,609,777 | 3/1997 | Apunevich et al. ...... 219/121.48 |
| 5,719,370 | 2/1998 | Appunevich et al. .... 219/121.49 |
| 5,782,952 | 7/1998 | Diaz et al. ............ 75/10.19 |
| 5,895,558 | 4/1999 | Spence ................. 204/164 |
| 5,896,877 * | 4/1999 | Pirker ................. 134/153 |
| 6,095,582 * | 8/2000 | Siniaguine et al. ..... 294/64.3 |

FOREIGN PATENT DOCUMENTS

| 3536432 | * | 4/1987 | (DE) . |
| 04080148 | * | 3/1992 | (JP) . |
| 11284057 | * | 10/1999 | (JP) . |
| 9745862 | * | 12/1997 | (WO) . |

* cited by examiner

Primary Examiner—Jeffrie R. Lund
Assistant Examiner—Sylvia R. MacArthur
(74) Attorney, Agent, or Firm—Skjerven Morrill MacPherson LLP; George Wolken, Jr.

(57) ABSTRACT

The present invention comprises a brim surrounding a wafer or wafer-like object during plasma etching in a non-contact wafer holder, such brim facilitating uniform flow of the plasma discharge around the edge of the wafer during plasma etching. The brim of the present invention avoids plasma instability and non-uniform flow typical of conventional plasma etching near the edges of the wafer being etched. The brim of the present invention, by facilitating uniform and stable plasma flows, decreases non-uniform etching. One embodiment of the present invention permits the brim to move in the axial direction from a position substantially. This permits the etching process to be controlled for more uniform and precise wafer etching as lowering the brim tends to shadow the edge region of the wafer from the plasma, reducing etching in the edge region while not significantly affecting etching in the central regions of the wafer. Another embodiment of the wafer includes a barrier on the upper side of the brim directed upward from the brim at an oblique angle away from the wafer. This barrier contacts the upper surface of the brim so as to leave a protrusion or debris-collecting shelf on the upper interior portion of the brim. This shelf in combination with the upward oblique barrier deflects the plasma and debris from plasma etching away from the wafer. Another embodiment of the invention includes a gas-controlling baffle in which gas flow around the edge of the wafer may be controlled to compensate for mechanical imprecision in the gap between the brim and the wafer and/or to provide an additional means of controlling etching in the vicinity of the edge of the wafer.

16 Claims, 5 Drawing Sheets

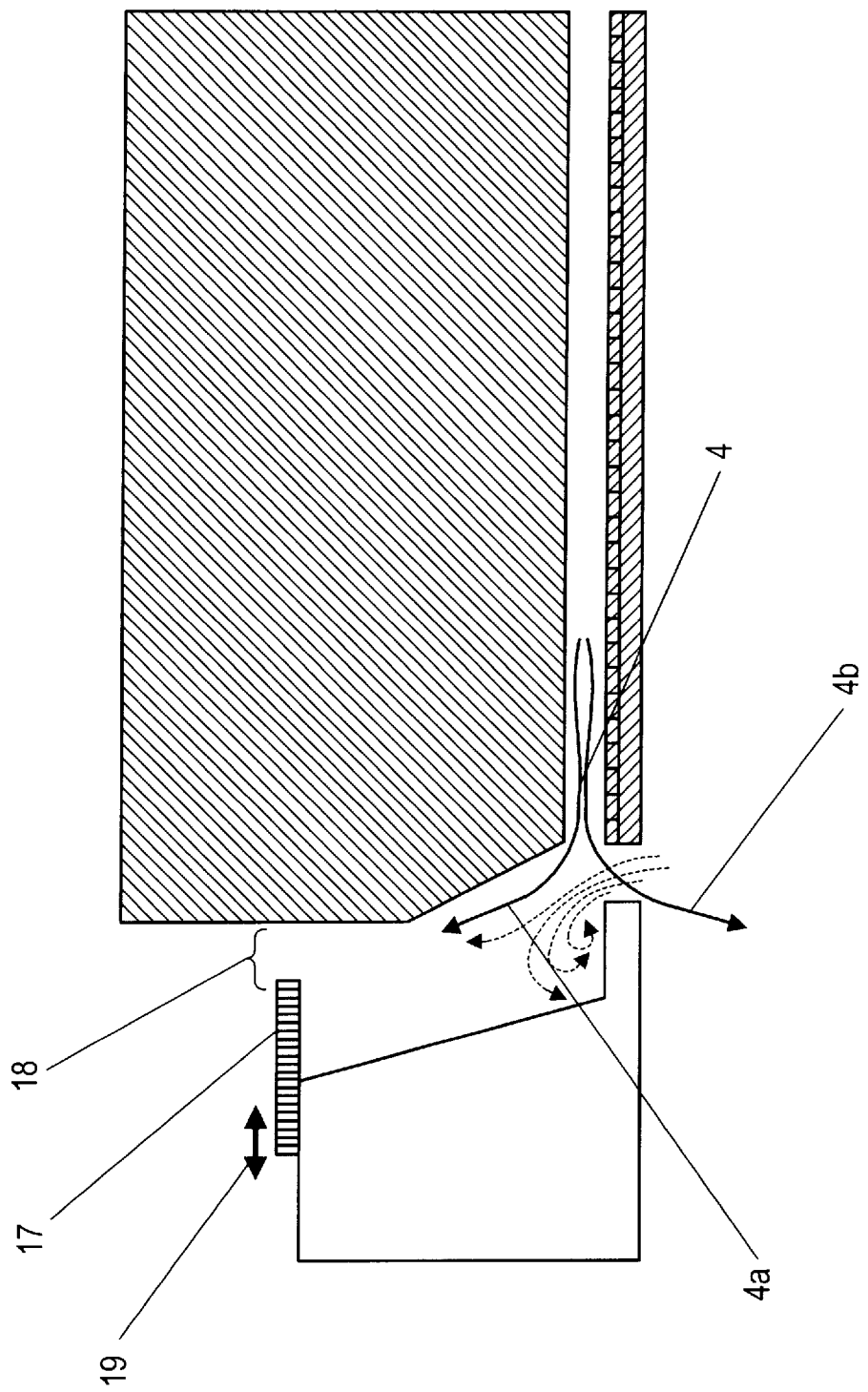

BRIM AND GAS ESCAPE FOR NON-CONTACT WAFER HOLDER

BACKGROUND OF THE INVENTION

1. Technical Field

The present invention relates to the field of plasma etching of wafer-like objects held in a non-contact wafer holder and, more particularly, to a brim and gas escape structure around the circumference of the wafer reducing unstable and non-uniform plasma traverse near the wafer's edge, while deflecting plasma and etching debris from the wafer's edge and unetched face and providing additional means of controlling wafer etching in the edge region.

2. Description of Related Art

Numerous areas of technology require that a workpiece be held in position while processes are performed thereon. The processing of semiconductor wafers into integrated circuits requires the wafer to be held by a suitable holder without impeding the processing steps directed to the exposed flat surface of the wafer. Following production of the integrated circuits, wafer processing is generally not finished. In particular, many areas of technology (cell phones, smart cards and the like) require that the integrated circuit providing the internal intelligence for the device be very thin. It is typically inconvenient to fabricate the integrated circuits directly on a thin wafer as distortion, non-uniform processing, perhaps even rupture, may occur during the several processing steps typically required for integrated circuit fabrication. Therefore, it is common practice for a wafer containing numerous fully fabricated integrated circuits thereon to be thinned by means of etching from the reverse side of the wafer. Plasma etching is the typical method for wafer thinning. For economy of language we will refer to the "face" of the wafer and intend thereby the face undergoing (or destined to undergo) etching, resulting in thinning of the wafer. The "opposite face" of the wafer denotes the face of the wafer not undergoing etching, typically having the integrated circuits thereon and lying in close proximity to the wafer holder.

Several challenges must be met for successful wafer thinning by plasma etching. The wafer is (or soon becomes) very thin, rendering it susceptible to distortion. Distortion would generally lead to non-uniform etching, non-uniform heating of the wafer and potential damage to the integrated circuits lying on the reverse face of the wafer from that being etched. Thus, an important challenge to be met by a wafer holder is the ability to hold thin, easily distorted wafers in a flat position during etch. Of course, the wafer holder must not contact the exposed integrated circuits lying on the opposite face. Thus, non-contact support for a flexible wafer must be provided.

To be definite in our description of the invention, we will describe the common instance of the processing of semiconductor wafers as may typically occur in the production of integrated circuits or in wafer post-processing for thinning, etc. However, the processing of any wafer-like object in a non-contact holder is also a potential area of application for the present invention. Flat panel displays and other rectangular, circular, star-shaped or irregularly shaped planar objects may require processing by means of a non-contact holder. For economy of language we will refer to all such wafer-like objects herein as "wafers" recognizing that such objects may be large and need not be rectangular, circular or regular in shape. Since semiconductor wafers are expected to be an important area of application for the present invention, we will describe the primary features of the present invention in terms of semiconductor processing, not intending to limit the invention to this particular choice or particular example. Semiconductor wafers aptly illustrate the features of the present invention and permit obvious modification for use in processing other wafer-like objects.

The floating of a wafer above a layer of compressed gas is described in the work of Pirker (U.S. Pat. No. 5,896,877). The wafer is held in position by gravity while the air cushion prevents contact with the wafer holder.

Work of Siniaguine and Steinberg (PCT International Publication No. WO 97/45862) describes a non-contact holder for wafer-like objects in which a vortex of rotating air provides both the vacuum support for the wafer and the air cushion.

One challenge to be met by a non-contact wafer holder relates to preventing debris from the plasma etch from contaminating the integrated circuits on the opposite face of the wafer. More stringently, the wafer holder should also prevent debris from impacting the thin edge of the wafer. Non-contact support invariably implies a gap between the wafer and the holder. Etching debris clearly need to be kept out of this gap. Preferably, the etching debris should also be kept from the wafer edge. While not as serious a problem as debris contacting the opposite face of the wafer, edge contamination may lead to rejection of the particular integrated circuits lying on the contaminated regions of the edge thus, reducing yield.

Plasma etching of a wafer typically occurs by means of the wafer passing through a largely stationary plasma discharge. The plasma discharge tends to preferentially dwell on the leading and trailing edges of the wafer as the wafer passes through the discharge rather than uniformly traversing onto and off of the wafer. This can lead to non-uniform etching. The brim structure of the present invention is intended to provide for a smooth transition of the plasma discharge onto and off of the wafer, facilitating thereby uniform etching of the entire wafer including the edge portions thereof.

BRIEF SUMMARY OF THE INVENTION

The present invention comprises a brim surrounding a wafer or wafer-like object during plasma etching in a non-contact wafer holder. This brim is preferably 20 mm to 25 mm in width, approximately 1.3 mm thick and the gap is substantially constant throughout the circumference of the wafer. The gap is preferably approximately 0.5 mm for etching of integrated circuit wafers. A brim so dimensioned and configured will facilitate the plasma discharge in flowing smoothly onto and off of the wafer, avoiding thereby the plasma instability and non-uniform flow typically of conventional plasma etching near the edges of the wafer being etched. The brim of the present invention, by facilitating uniform and stable plasma flows, decreases non-uniform etching.

One embodiment of the present invention permits the brim to move in the axial direction from a position substantially aligned with the lower face of the wafer to a position typically 1 mm to 3 mm below the plane of the wafer. This permits the etching process to be controlled for more uniform and precise wafer etching as lowering the brim tends to shadow the edge region of the wafer from the plasma, reducing etching in the edge region while not significantly affecting etching in the central regions of the wafer.

Another embodiment of the wafer includes a barrier on the upper side of the brim, that is the side opposite the plasma. This barrier is directed upward from the brim at an oblique angle away from the wafer. This barrier contacts the upper surface of the brim so as to leave a protrusion or debris-collecting shelf on the upper interior portion of the brim. This shelf in combination with the upward oblique barrier deflects the plasma and debris from plasma etching away from the wafer. Debris is typically deposited on the shelf portion of the brim from which it is readily cleaned following the etching process.

Yet another embodiment of the present invention includes a baffle for controlling the vertical flow of gas exiting from the non-contact wafer holder. Additional control of the etching process (especially near the edge of the wafer) is obtained by adjusting the baffle to direct the gas flow to a greater or lesser degree in the direction towards the wafer holder versus escaping around the wafer's edge.

BRIEF DESCRIPTION OF THE DRAWINGS

The drawings herein are not to scale.

FIG. 2a: Cross sectional schematic view of brim structure of present invention including adjustable baffle.

DETAILED DESCRIPTION OF THE INVENTION

In the following description and figures, similar reference numbers are used to identify similar elements.

Figure 1:
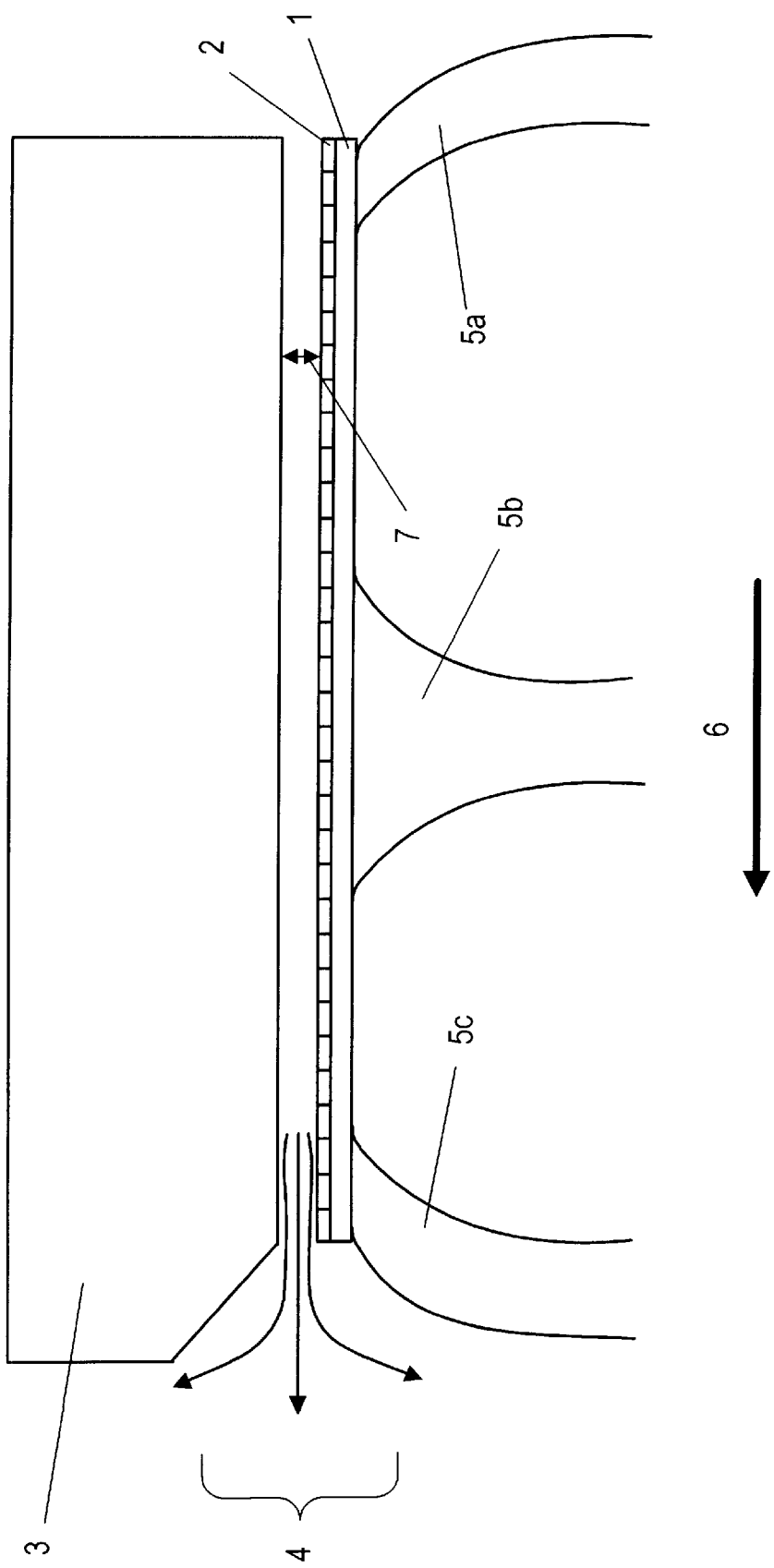
FIG. 1: Schematic cross sectional view of a wafer-like object in a non-contact wafer holder undergoing plasma etch, depicting typical leading edge, central and trailing edge plasma discharges.

FIG. 1 depicts schematically and in cross section (but not to scale) a wafer-like object ("wafer") undergoing plasma etching. The wafer, 1, may optionally have integrated circuits or other structures, 2, fabricated on the face of the wafer nearer the wafer holder, 3. A common non-contact wafer holder, 3, could hold wafer, 1, (for example) by means of vortex-created partial vacuum attraction while providing an air (or similar gas) cushion, 4, preventing direct contact between wafer and holder. Wafer, 1, may be supported from above by vortex-created partial vacuum generated by numerous vortex "chucks" on the face of the wafer holder. These individual vortex chucks are not depicted in the figures. The air may exit from each vortex chuck preferentially in certain directions, merging in the region between wafer and holder into the overall partial vacuum support and air cushion in a complex flow pattern. The net flow of air around the wafer denoted as 4 in FIG. 1 may not exit from the gap between the wafer and holder completely uniformly in all radial directions. However, even in such cases, significant air exits from all regions of the circumference of the wafer holder to provide adequate separation of wafer and wafer holder, 7, typically 0.10 mm to 0.40 mm. The present invention is not limited to use with a particular form of non-contact wafer holder but may be used with advantage to stabilize the plasma and deflect etching debris in many types of non-contact holders.

Wafer, 1, would typically be etched by causing a plasma discharge to pass across the face of the wafer removing material from the wafer while so doing. In practice, the wafer would typically be in motion with respect to the laboratory and pass through a stationary plasma. However, it is more convenient and economical of language to describe the present invention as if the wafer and wafer holder were stationary and the etching plasma passed over the wafer's face. Descriptions given in terms of a stationary wafer are simply translated into a frame with stationary plasma by reversing directions of motion.

FIG. 1 denotes as 6 the direction of travel of the plasma across the face of the wafer, 1. Plasma discharge would first encounter the wafer as 5a, move across the face of the wafer, typically as 5b, and move off the wafer as 5c. The preferred shape of the plasma discharge is 5b for uniformity of etching. However, in typical plasma etching processes, the plasma discharge tends preferentially to dwell on the face of the wafer when entering or leaving the wafer surface, depicted as 5a and 5c. This preferential attraction typically leads to distortion of the shape of the discharge as schematically depicted by 5a and 5c. Thus, plasma flow is unstable near the edges of the wafer. This distortion of the plasma discharge, instability of the plasma and preferential attraction of the discharge for the wafer may result in uneven etching. Thus, one problem to be addressed by the brim and gas escape structure of the present invention is to reduce or eliminate the plasma non-uniformities depicted as 5a and 5c. More uniform etching is achieved as the plasma discharge is rendered more stable near the edges of the wafer.

Figure 2:
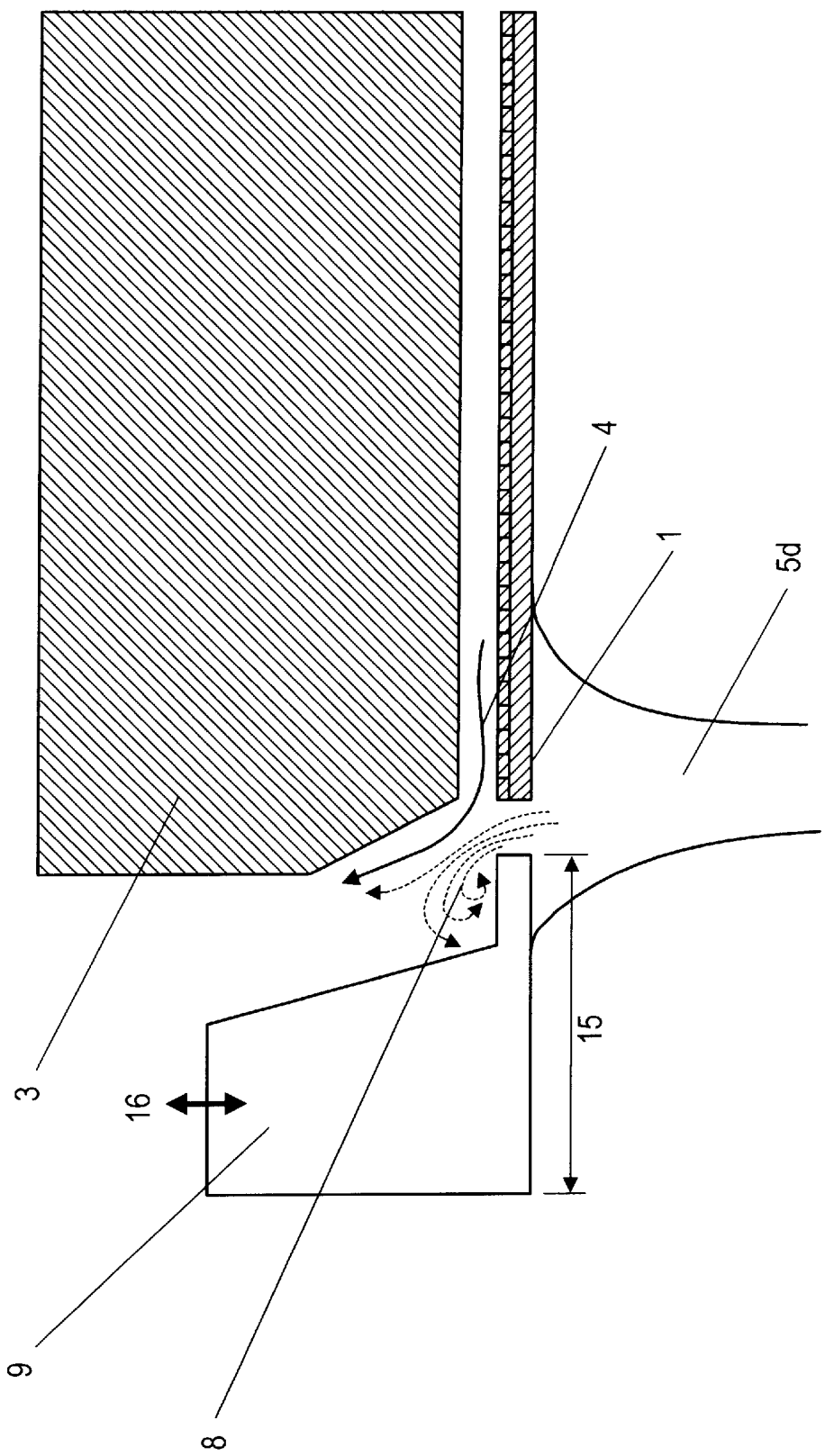
FIG. 2: Cross sectional schematic view of brim structure of present invention.
Figure 3:
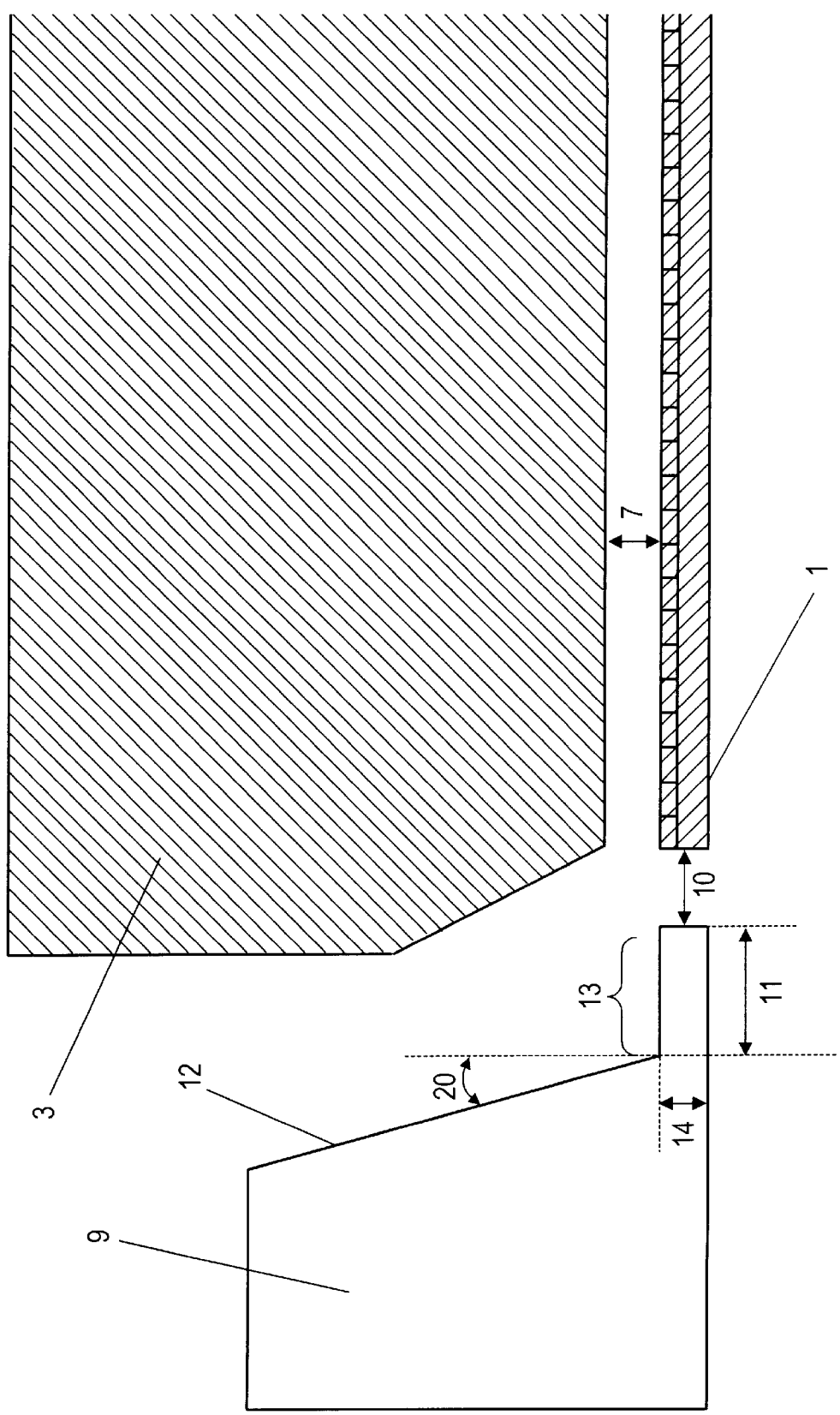
FIG. 3: Expanded cross sectional schematic view of brim structure of present invention.

FIGS. 2 and 3 depict a brim and gas escape structure of the present invention (not to scale) as 9. The structure, 9, depicted in FIGS. 2 and 3 is generally annular in shape having the same central axis as that of the wafer holder, 3. One part of the cross section is depicted in FIGS. 2 and 3, the full structure being obtained by rotation of 9 about the vertical central axis of the wafer holder, 3.

Brim, 9, is typically located in proximity to the edge of the wafer leaving a gap of about 0.5 mm, 10. This gap is sufficiently small that edge effects of the plasma discharge are substantially reduced or eliminated. Direct contact between wafer, 1, and brim, 9, is contraindicated for several reasons. The radial force resulting from direct contact between brim and wafer may lead to distortion or buckling of the wafer, especially for very thin wafers. Direct contact would typically affect etching at the very edge of the wafer as well. Therefore, a small gap, 10, is preferred in the practice of the present invention.

The presence of gap, 10, causes plasma discharge on the edge region of the wafer to take on a form, 5d, more characteristic of the desired plasma discharge shape, 5b. Therefore, plasma distortion near the edge of the wafer is substantially reduced or eliminated, resulting in more uniform etching of the entire wafer.

Brim, 9, should not be etched by the plasma, 5d in order to maintain its dimensional integrity and structure for long periods of etching. Typical plasma discharges etch by means of fluorine while brim, 9, is typically made of aluminum, not etched by fluorine.

Gas dynamic effects are also used to improve the plasma etching according to the present invention. Plasma gas typically has very fast and vigorous flow, 8, which will penetrate gap, 10, and deflect air, 4, upward. Yet another advantage of the present invention is the structure keeping plasma and the debris carried by the plasma from contaminating both the upper face of the wafer and the edge. This is accomplished according to the present invention by providing a debris collector, 13. Collector, 13, is typically about 0.5 mm to about 1.3 mm thick (14 in FIG. 3) while providing a platform surface, 13 about 1 mm to about 3 mm in length.

This platform would typically be adjacent to upward directed wall, 12. Typically wall 12 would have an angle of about 0 deg. to 60 deg (20 in FIG. 3) from vertical.

The structure described herein induces plasma passing through gap, 10 to collide with air stream, 4, and typically execute turbulent, swirling motion, 8. This swirling motion, 8, tends to deposit debris carried by the plasma onto shelf 13. Thus, the structure of the present invention keeps both the opposite face of the wafer and the edge free from plasma etching and debris carried by plasma etching.

An additional embodiment of the present invention is depicted in FIG. 2A. An adjustable baffle, 17, may be included with the brim structure of the present invention. The purpose of baffle 17 is to provide additional control of the gas flow, 4, both in the direction towards the wafer holder, 4a, and in the opposite direction, 4b. Adjustment of baffle 17 changes the resistance to gas flow in the direction of 4a. Thus, baffle 17 can cause more or less gas to travel in direction 4a, and simultaneously less or more gas to travel in direction 4b. Baffle 17 may adjust the resistance to gas flow by being physically movable in direction 19, changing thereby the gap 18 for gas flow. Preferably, baffle 17 would be fixed in position leaving a small (or no) gap, 18. In this embodiment, baffle 17 would typically be provided with several holes through which gas could flow in direction 4a. Some fraction of the holes in baffle, 17, could be plugged prior to processing, leading to adjustment of flow 4a on a case-by-case basis depending on the number and location of holes plugged.

In practical wafer processing systems, the gap between the wafer and brim, 10, may not be precisely machined. Thus, the adjustable features of baffle, 17, could be used to compensate for variations in the gas escape 4b arising from normal variation in manufacturing tolerance.

Additionally, the adjustment of baffle 17 can be used to adjust the plasma etching in the region of the edge of wafer, 1. That is, increased flow in the direction 4b (decreased flow in direction 4a) reduces the etching of the edge region of wafer, 1. For very thin wafers, it is frequently advantageous to leave a thicker region around the circumference of the wafer to facilitate handling of the wafer in later processing steps. Control of gas flow 4a, 4b, by the baffle of the present invention is a means for accomplishing this result.

Figure 4:
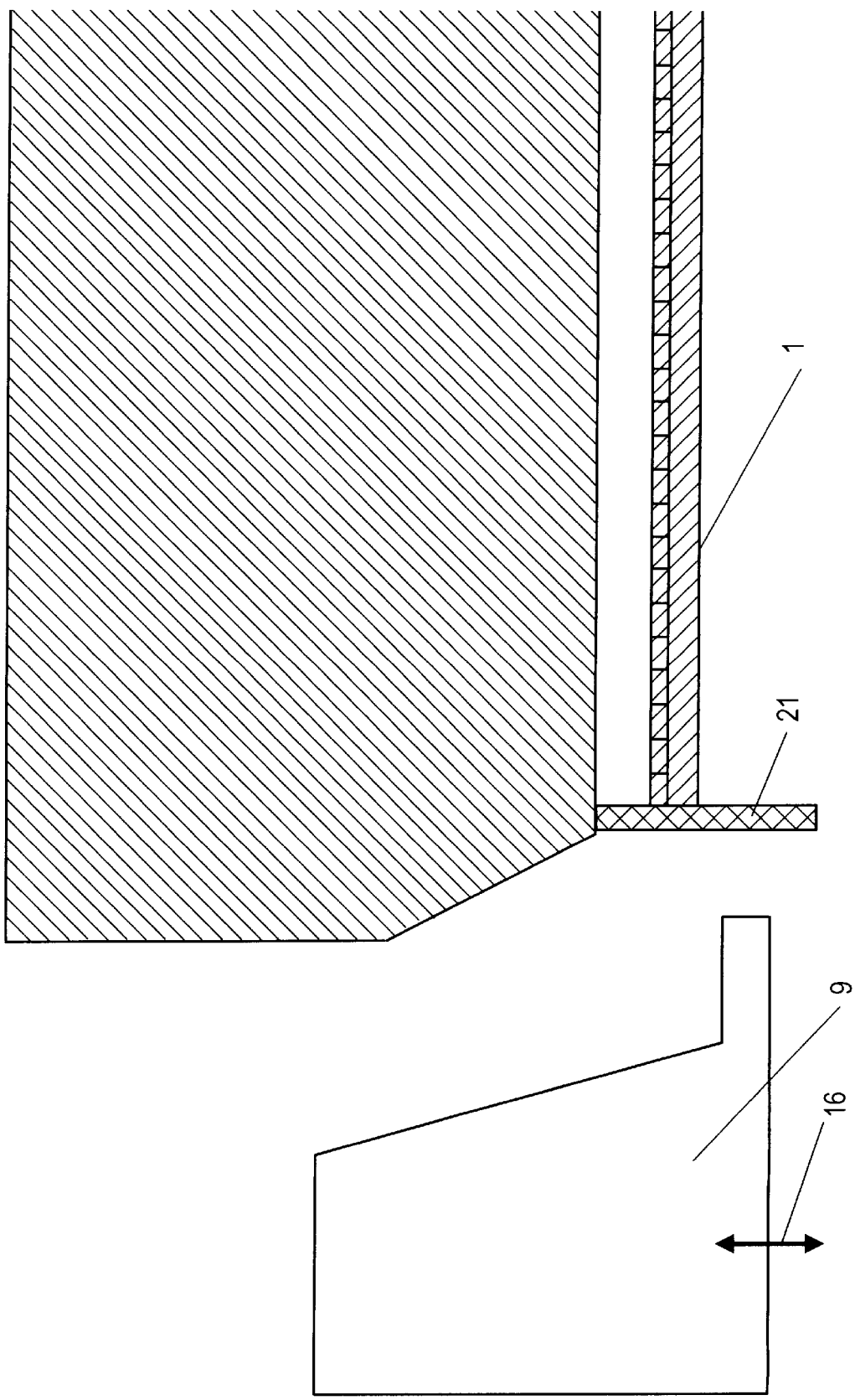
FIG. 4: Expanded cross sectional schematic view of brim structure of present invention also depicting a limiting pin.

During processing, the wafer holder is typically one of several in a carousel rotating around a central axis. This results in a centrifugal force tending to push the wafer, 1, against the circumference of the carousel. Limiting pins are typically provided against which the wafer is centrifugally pressed to maintain a constant location within the holder during processing. One such limiting pin is depicted as 21 in FIG. 1. The limiting pins occupy only a very small fraction of the circumference of the wafer holder, having no significant effect on the gas dynamics described elsewhere herein. However, we depict in FIG. 4 one such limiting pin, 21, to illustrate that the limiting pin, not brim, 9, keeps the wafer in the holder, permitting brim, 9, to be displaced in the direction 16. FIG. 4 depicts brim, 9, in a lower position than in FIGS. 2, 2a and 3. Thus, brim location may be adjusted to affect gas flow as may be desired by the process engineer. The width of the brim, 15 in FIG. 2, is typically 20 to 25 mm. In an embodiment of the present invention the brim can be moved to various axial positions with respect to the wafer. That is, the brim can be moved in direction 16. Lowering the brim (in the direction of the plasma) causes the brim partially to shield ("shadow") the edge of the wafer from the plasma, thereby lowering the etch rate in the edge region.

Typically, in this embodiment of the present invention, the brim may be lowered to a position of approximately 1–3 mm. below the position of the wafer. Etch rate near the edge of the wafer can thus be controlled by suitable vertical positioning of the brim structure of the present invention.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A brim for a wafer-like workpiece in a non-contact holder comprising a disk encompassing the circumference of said workpiece at a substantially constant distance therefrom, having an upper surface on the side of said disk towards said holder and a lower surface on the opposite side thereof.

2. A brim as in claim 1 wherein said substantially constant distance is approximately 0.5 millimeter.

3. A brim as in claim 1 wherein said disk has a thickness from approximately 0.5 mm to approximately 1.3 millimeter.

4. A brim as in claim 1 wherein said disk is substantially annular in shape.

5. A brim as in claim 4 wherein said disk is from approximately 20 millimeters to approximately 25 millimeters in radial distance from the inner circumference to the outer circumference thereof.

6. A brim as in claim 1 surrounding said wafer-like object during etching thereof, wherein said disk is unetched.

7. A brim as in claim 6 wherein said disk is aluminum.

8. A brim as in claim 1 further comprising a continuous circumferential barrier on said upper surface of said disk, said barrier contacting the upper surface of said disk at a location displaced radially outward from the inner circumference of said disk.

9. A brim as in claim 8 wherein said barrier contacts said upper surface of said disk at a location from approximately 1 millimeter to approximately 3 millimeters from said inner circumference of said disk.

10. A brim as in claim 8 wherein said barrier extends upward at an oblique angle away from said workpiece.

11. A brim as in claim 10 wherein said oblique angle is less than about 60 degrees from vertical.

12. A brim as in claim 8 further comprising a baffle connected to said barrier, said baffle directed from said barrier in the direction of said holder providing thereby resistance to gas flow between said barrier and said holder.

13. A brim as in claim 12 wherein said baffle is movingly connected to said barrier permitting thereby said resistance to gas flow to be varied.

14. A brim as in claim 12 further comprising sealable openings through said baffle.

15. A brim as in claim 1 further comprising a displacement mechanism translating said disk in a direction substantially perpendicular to the radial direction of said disk.

16. A brim as in claim 15 wherein said displacement mechanism displaces said disk from approximately the plane of said workpiece to approximately 3 millimeters from the plane of said workpiece in the direction away from said holder.

\* \* \* \* \*